(12) United States Patent
McClure et al.

(10) Patent No.: US 7,046,511 B2
(45) Date of Patent: May 16, 2006

(54) COMPUTER HAVING CONFIGURABLE EXPANSION CARD SLOT LOCATIONS

(75) Inventors: Linden H. McClure, Milliken, CO (US); Roger A. Pearson, Fort Collins, CO (US); Jonathan D Bassett, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/903,073

(22) Filed: Jul. 30, 2004

(65) Prior Publication Data

US 2006/0023428 A1 Feb. 2, 2006

(51) Int. Cl.
*G06F 1/16* (2006.01)

(52) U.S. Cl. ............ 361/685; 361/740; 439/347; 248/680

(58) Field of Classification Search ........ 361/759, 361/796, 801, 724–727, 679–687, 753, 740, 361/736; 439/327, 347, 911; 248/680, 681
See application file for complete search history.

(56) References Cited

U.S. PATENT DOCUMENTS

| 6,856,518 B1* | 2/2005 | Dobbs et al. ........... 361/801 |
| 2003/0063454 A1* | 4/2003 | Wilson et al. .......... 361/796 |
| 2003/0107878 A1* | 6/2003 | Kaminski .............. 361/759 |

OTHER PUBLICATIONS

ATX Specification. Version 2.2. pp. 1-26.

* cited by examiner

*Primary Examiner*—Hung Van Duong
(74) *Attorney, Agent, or Firm*—Kevin M. Hart (57) ABSTRACT

A computer includes a motherboard having first and second sets of expansion card slots, an expansion card bulkhead defining expansion card openings, and a configurable alignment mechanism operable to place the motherboard and the expansion card openings into first and second configurations relative to one another. In the first configuration, the first set of expansion card slots is aligned with the openings. In the second configuration, the second set of expansion card slots is aligned with the openings.

16 Claims, 7 Drawing Sheets

COMPUTER HAVING CONFIGURABLE EXPANSION CARD SLOT LOCATIONS

FIELD OF THE INVENTION

This invention relates generally to expansion card slots in computers.

BACKGROUND

Computer motherboards typically include a number of slots into which expansion cards may be installed to supplement the functionality that is integrated onto the motherboard itself. For example, a graphics card might be installed in one expansion slot, a network interface card in another expansion slot, and so on. Motherboards also typically are designed to comply with one or more industry standard form factors so that they may be used with enclosures and power supplies from a variety of manufacturers.

One of the challenges that face designers and manufacturers of motherboards is that expansion card interface technology continually changes. For instance, at one time the most popular expansion card interface technology was ISA technology. Later, PCI technology began to replace ISA technology. Then AGP technology was introduced for accelerated graphics, and PCI technology evolved to include PCI-Express variants. Moreover, transitions from one expansion card technology to another do not occur at discrete times; rather, they occur over periods of years. Therefore, motherboard manufacturers generally must support more than one type of expansion card interface technology simultaneously on a single motherboard.

In recognition of this challenge, the popular industry-standard ATX form factor allows for up to seven expansion slots on a single motherboard, and these seven slots may be occupied by a variety of different technologies. For example, three of the slots might be configured to receive ISA expansion cards, two of the slots might be configured to receive PCI expansion cards, one of them might be configured to receive either an ISA or a PCI expansion card, and the seventh slot might be configured to receive an AGP graphics expansion card.

While the ATX form factor thus provides some flexibility for motherboard manufacturers in this regard, it also imposes significant constraints: The ATX form factor contemplates no more than seven expansion slots on a single board, and those seven slots must be placed in very specific locations measured relative to prescribed motherboard mounting holes and relative to the edges of the motherboard itself. It would be desirable to provide more than seven expansion slots on a single motherboard to support a greater variety of expansion card technologies, and to do so in a manner that allows the motherboard to remain compliant with industry standard form factors such as the ATX form factor.

SUMMARY OF THE INVENTION

A computer according to a preferred embodiment of the invention includes a motherboard having first and second sets of expansion card slots, an expansion card bulkhead defining expansion card openings, and a configurable alignment mechanism operable to place the motherboard and the expansion card openings into first and second configurations relative to one another. In the first configuration, the first set of expansion card slots is aligned with the openings. In the second configuration, the second set of expansion card slots is aligned with the openings.

In one aspect, the total number of expansion card slots may be greater than seven.

In another aspect, slots in the first set may include only those in industry-standard locations, while slots in the second set may include only those in non-industry-standard locations.

In another aspect, at least one of the sets may be mixed to include slots in industry-standard as well as non-industry-standard locations.

DETAILED DESCRIPTION OF THE PREFERRED EMBODIMENTS

General Implementation

Figure 1:
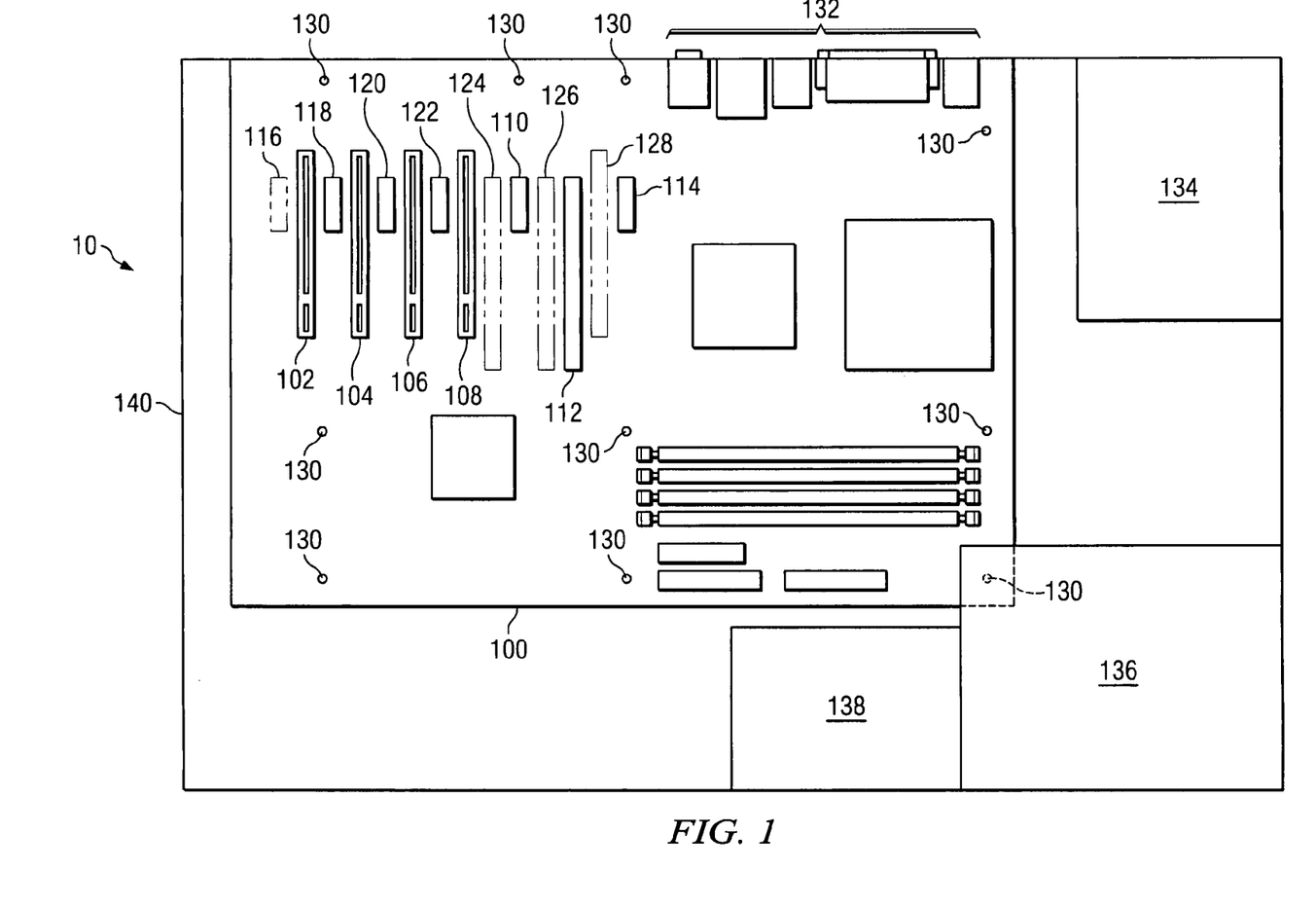
FIG. 1 is a plan view illustrating a computer having configurable expansion card slot locations according to a preferred embodiment of the invention.

Referring now to FIG. 1, a computer 10 according to a preferred embodiment of the invention may include a chassis or enclosure 140 and a motherboard 100. Typically, but not necessarily, computer 10 will also include a power supply unit 134, a 5.25 inch bay 136 and a 3.50 inch bay 138. The selection and arrangement of the system components shown in the drawing is provided by way of illustration only. In alternative embodiments, different system components may be provided, and the system components chosen may be arranged differently than they are in the illustration. Mounting points 130 are typically provided on motherboard 100 so that motherboard 100 may be securely mounted either to chassis or enclosure 140 or to a tray or frame that is mounted to chassis or enclosure 140. Frequently, mounting points 130 take the form of through holes formed in motherboard 100 for receiving screws; other types of mounting points may be employed depending on the fastening technique chosen. The locations of mounting points 130 may vary depending on the industry standard with which motherboard 100 is designed to comply. Rear input/output ("I/O") connector area 132 is occupied by connectors related to functions that are integrated onto the motherboard itself as opposed to supplemental functions that are provided by expansion cards. For example, rear I/O connector area 132 might include connectors for a mouse and keyboard, several USB ports, a parallel port, and so on.

Motherboard 100 includes expansion card slots 102–128. Each of expansion card slots 102–128 may be populated with an expansion card connector, although it is not necessary that each slot be populated. Each of the slots may host any type of expansion card technology. For example, in the embodiment shown, slots 102–108 are configured to receive PCI expansion cards, slots 110, 114 and 118–122 are configured to receive PCI-Express-1 expansion cards, slot 112 is configured to receive a PCI-Express-16 expansion card, and the remaining slots are not populated. In total, there are fourteen expansion card slots on motherboard 100. In other embodiments, more or fewer than fourteen slots may be provided.

Slots 102–114 may be located on motherboard 100 according to an industry standard. For example, if they are located according to the ATX standard, then there should be a socket spacing of 0.800 inches as measured between pin 1 of each adjacent same-technology socket, pin 1 of slot 102 should be offset a certain number of inches to the left of the top-left motherboard mounting hole, and so on. Slots 116–128, however, may be located in non-standard locations. In the embodiment shown, non-standard slot 116 is located just to the left of standard slot 102, and non-standard slots 118–128 are located in the spaces between standard slots 102–114.

Figure 2:
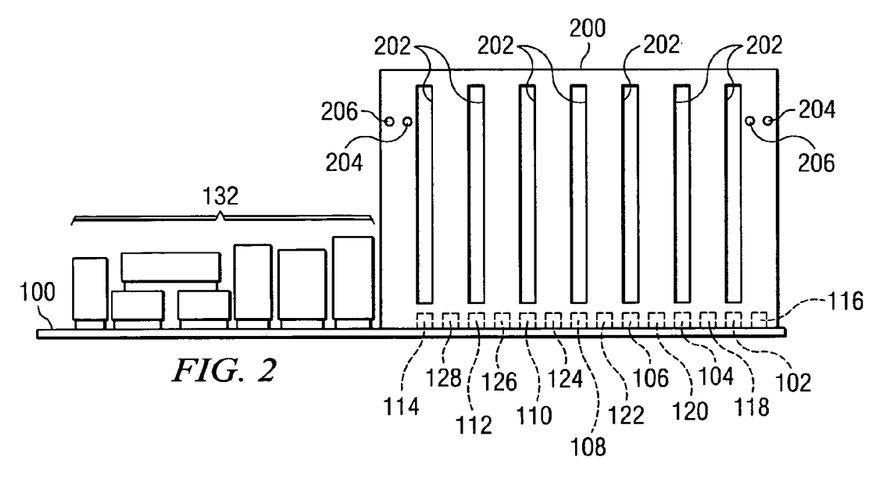
FIGS. 2 and 3 are rear views illustrating the motherboard of FIG. 1 and an expansion card bulkhead in first and second configurations according to a preferred embodiment of the invention.
Figure 3:
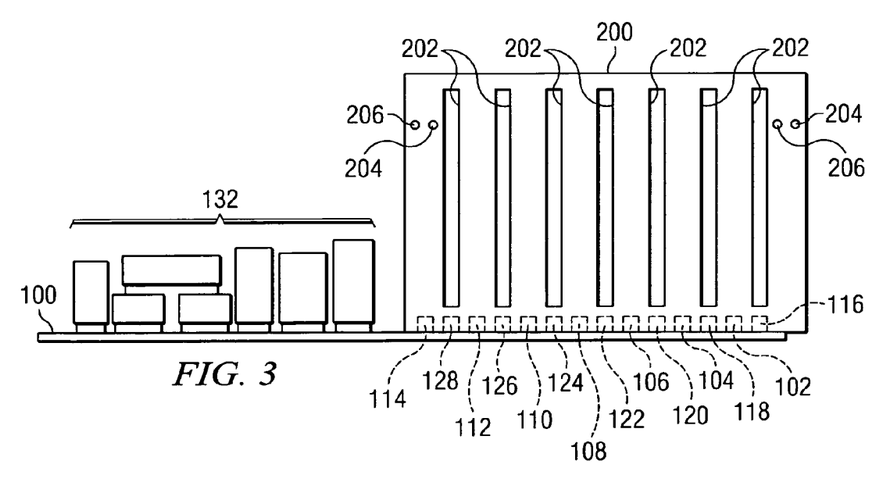

Referring now to FIGS. 2 and 3, computer 10 may include one or more expansion card bulkheads such as bulkhead 200. Bulkhead 200 includes one or more expansion card openings 202. These openings provide access through chassis or enclosure 140 to connectors mounted on expansion cards that reside in one or more of the expansion slots of motherboard 100. Preferably, although not necessarily, bulkhead 200 may be constructed from an electrically conductive material such as sheet metal so that it can provide some shielding to prevent electromagnetic interference ("EMI") from exiting computer 10 in the area of the expansion card slots. Note that, in FIGS. 2 and 3, all of expansion slots 102–128 are shown populated with sockets for clarity.

Preferably, computer 10 includes a configurable alignment mechanism operable to place one or more of the expansion card slots of motherboard 100, and one or more of the expansion card openings 202, into at least first and second configurations relative to one another. In the first configuration, a first set of the expansion card slots will be aligned with openings 202. In the second configuration, a second set of the expansion card slots will be aligned with openings 202. For example, in the configuration illustrated in FIG. 2, openings 202 are aligned only with standard slots 102–114. But in the configuration illustrated in FIG. 3, openings 202 are aligned only with non-standard slots 116–128. In alternative embodiments, the accessible slots may be freely mixed such that at least one standard and one non-standard slot may be aligned with an opening in at least one of the first and second configurations.

The configurable alignment mechanism may take a variety of forms, an illustrative number of which will now be described in more detail.

Configurable Motherboard Embodiments

A first general category of configurable alignment mechanisms includes those in which the motherboard may be moved to achieve the first and second configurations.

Figure 4:
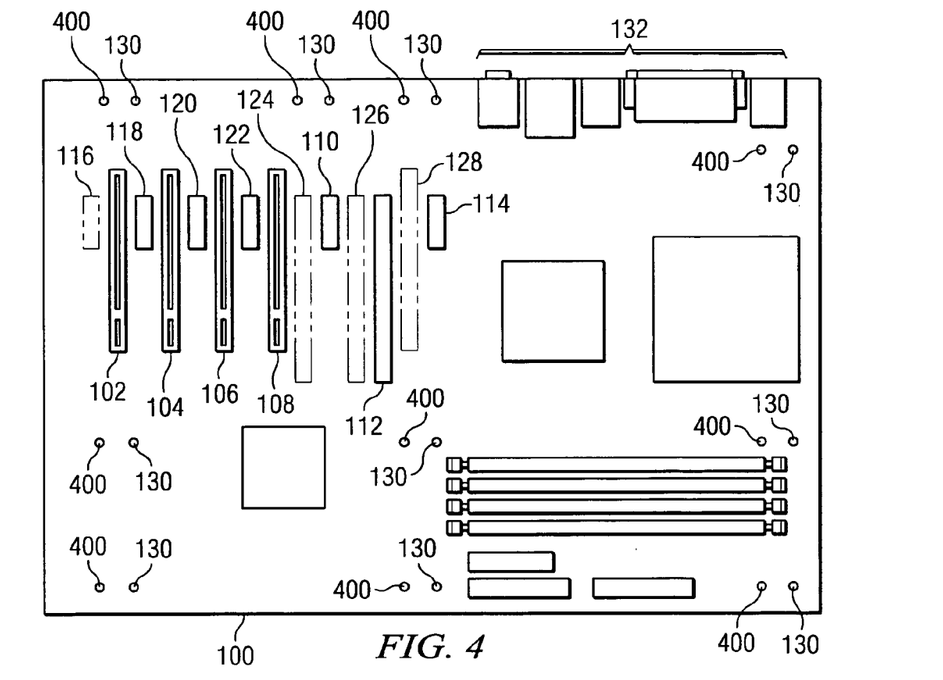
FIG. 4 is a plan view illustrating the motherboard of FIG. 1 equipped with multiple mounting points according to a preferred embodiment of the invention.

According to one technique, motherboard 100 may include a second set of mounting points 400 in addition to mounting points 130, as shown in FIG. 4. Preferably, mounting points 400 are offset from mounting points 130 by the same distance that slots 116–128 are offset from slots 102–114. In this manner, attaching motherboard 100 to chassis, frame or enclosure 140 at mounting points 130 can cause slots 102–114 to be aligned with expansion card openings 200, while attaching motherboard 100 to the same chassis, frame or enclosure at mounting points 400 can cause slots 116–128 to be aligned with expansion card openings 200.

Figure 5:
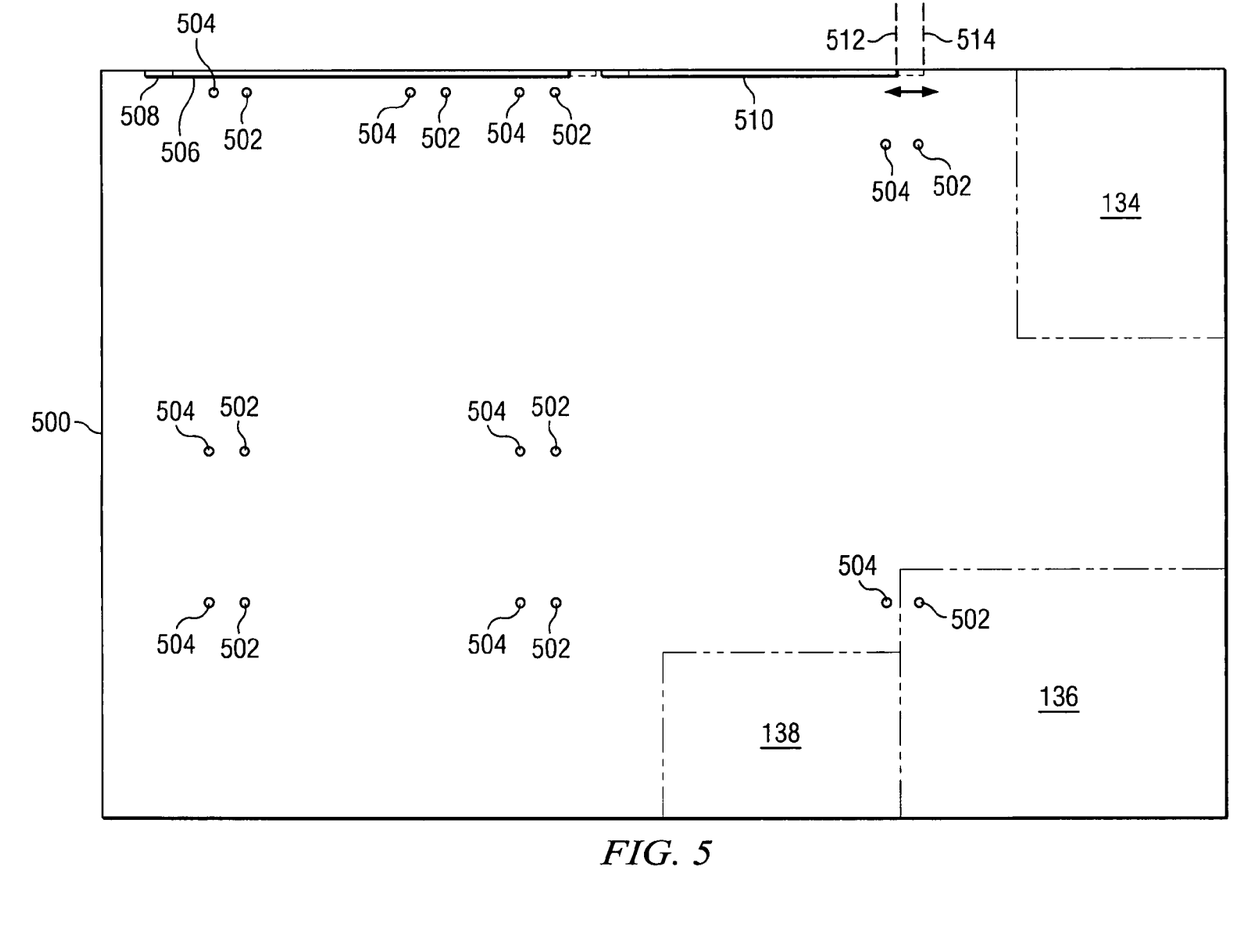
FIG. 5 is a plan view illustrating the chassis or enclosure of FIG. 1 equipped with multiple mounting points according to a preferred embodiment of the invention.

A variation of this technique is to provide just a single set of mounting points on motherboard 100, but two sets of corresponding mounting points 502, 504 on a chassis, frame or enclosure 500, as shown in FIG. 5. Preferably, mounting points 504 are offset from mounting points 502 by the same distance that slots 116–128 are offset from slots 102–114 so that either of the first or the second configurations may be achieved by mounting the motherboard to the chassis, frame or enclosure at one of the two sets of mounting points. Another variation of this technique is to provide two or more chassis, frames or enclosures—one having just mounting points 502 and the other having just mounting points 504. According to this variation, mounting the motherboard in one chassis, frame or enclosure produces the first configuration, while mounting the motherboard in the other chassis, frame or enclosure produces the second configuration. Alternatively, differently configured or differently located expansion card bulkheads 506, 508 may be included with two different chassis, frames or enclosures 500, while the motherboard may be mounted at the same mounting points within the two chassis, frames or enclosures. The different openings defined by the different expansion card bulkheads 506, 508 can produce the first and second configurations depending on which chassis, frame or enclosure is chosen.

Figure 6:
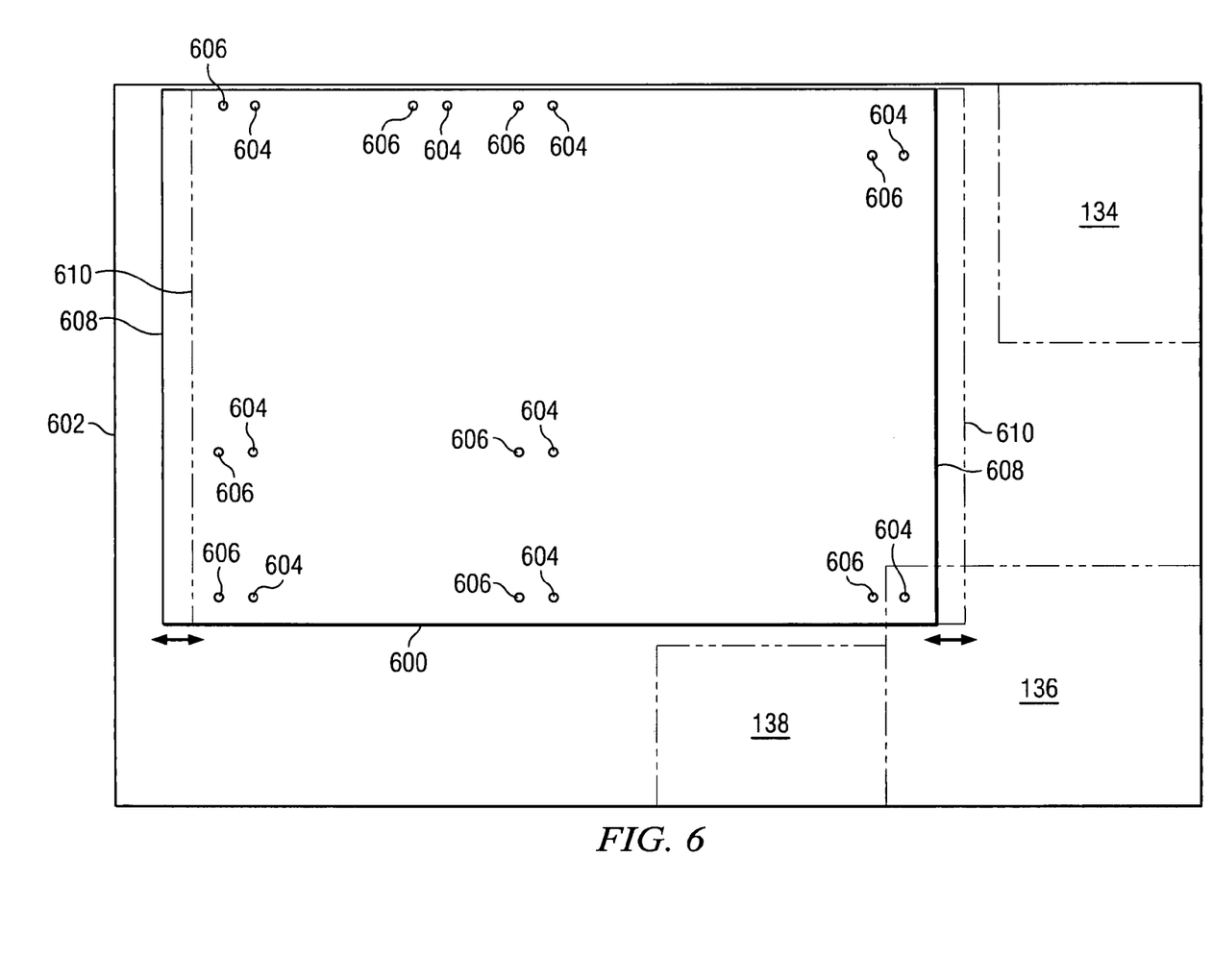
FIG. 6 is a plan view illustrating the chassis or enclosure of FIG. 1 with a tray or frame therein according to several preferred embodiments of the invention.

According to another technique, motherboard 100 may be mounted to a tray or frame 600, as shown in FIG. 6. Tray or frame 600 may be mounted to a chassis or enclosure 602 of computer 10. Both tray/frame 600 and chassis/enclosure 602 should include a first set of mounting points 604. And either chassis/enclosure 602 or tray/frame 600 may be provided with a second set of mounting points 606, offset from mounting points 602 by the same distance that slots 102–114 are offset from slots 116–128. Mounting tray/frame 600 to chassis/enclosure 602 at mounting points 604 produces the first configuration, while mounting tray/frame 600 to chassis/enclosure 602 at mounting points 606 produces the second configuration.

According to yet another technique, tray or frame 600 may be slidingly mounted to chassis/enclosure 602. The tray or frame may slide between first and second positions 608, 610 within the chassis such that the first position produces the first configuration and the second position produces the second configuration. Any suitable sliding mechanism may be used to accomplish this. For example, tabs or rollers maybe engaged with corresponding longitudinal channels to guide and support the tray or frame as it slides between first and second stops. Other arrangements may also be employed with similar effect.

Figure 7:
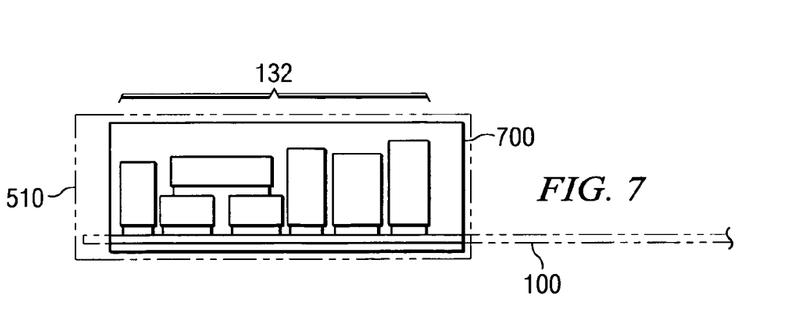
FIGS. 7 and 8 are rear views illustrating a mechanism for adapting to the movement of the rear I/O connector area of FIG. 1 according to a preferred embodiment of the invention.
Figure 8:
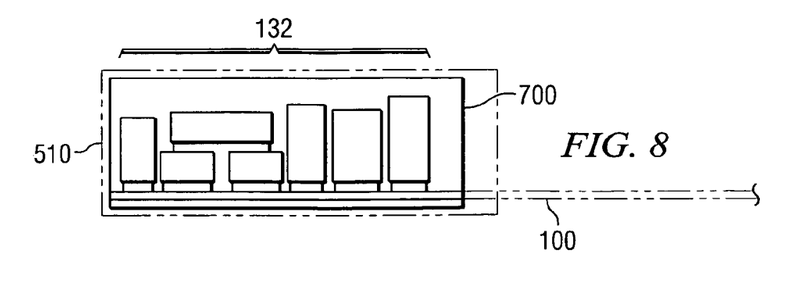

In any of the above techniques, rear I/O connector area 132 will move relative to the chassis or enclosure as motherboard 100 moves. Therefore, it may be desirable to provide a mechanism for adapting to the movement of I/O connector area 132 within the chassis or enclosure. This may be accomplished in a variety of ways. According to one technique, the width of an I/O aperture 700 (see FIGS. 7 and 8) in the chassis or enclosure may be over-sized so that it clears the rear I/O connectors on the left and the right regardless of whether motherboard 100 is in the first configuration (FIG. 7) or the second configuration (FIG. 8). An I/O aperture bulkhead 510 (FIGS. 5, 7 and 8) may be provided and configured to slidingly engage with a rear panel of the chassis or enclosure so that I/O aperture bulkhead 510 may move along with motherboard 100 between the first and second configurations as shown at 512, 514. I/O aperture bulkhead 510 covers I/O aperture 700 in either configuration. Preferably, although not necessarily, I/O aperture bulkhead 510 may be constructed from an electrically conductive material so that it may provide some EMI shielding around the openings in I/O connector area 132.

Configurable Expansion Card Opening Embodiments

A second general category of configurable alignment mechanisms includes those in which the expansion card openings may be moved to achieve the first and second configurations.

According to one technique, expansion card bulkhead 200 may be equipped with first and second sets of mounting points 204, 206 (see FIGS. 2 and 3) for attaching it to a chassis or enclosure. The two sets of mounting points may be offset from one another by the same distance that slots 102–114 are offset from slots 116–128. In this manner, attachment of the bulkhead at mounting points 204 may produce the first configuration, while attachment of the bulkhead at mounting points 206 may produce the second configuration. A variation of this technique is to provide two sets of mounting points on the chassis or enclosure rather than on the bulkhead.

According to another technique, a sliding engagement may be provided for mounting expansion card bulkhead 200 to the chassis or enclosure such that the bulkhead may slide between first and second positions as does I/O aperture bulkhead 510 (see FIG. 5). The first position may produce the first configuration, while the second position may produce the second configuration.

Figure 9:
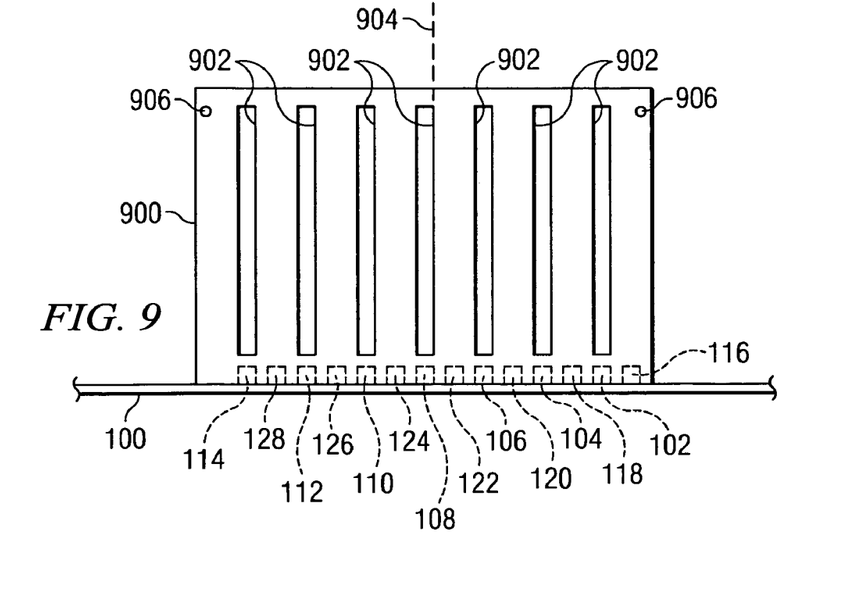
FIGS. 9 and 10 are rear views illustrating a reversible expansion card bulkhead according to a preferred embodiment of the invention.
Figure 10:
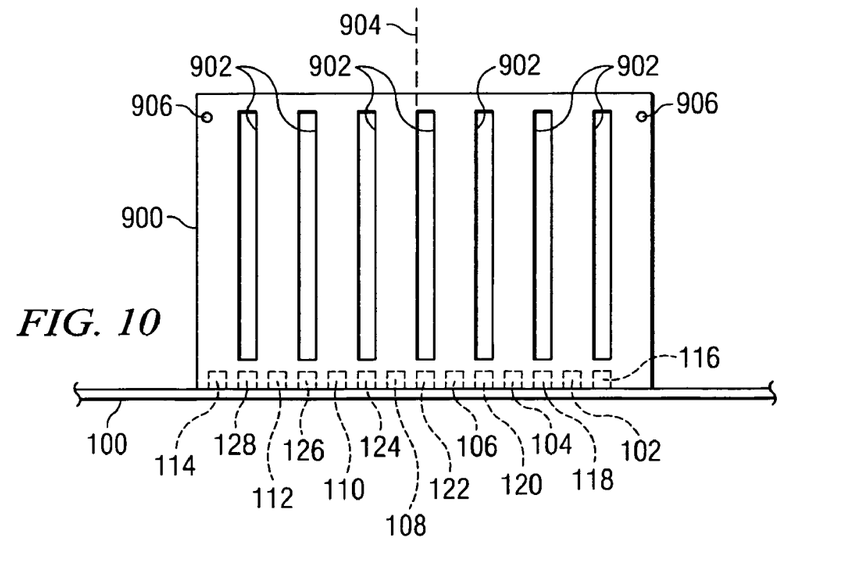

According to yet another technique, an expansion card bulkhead 900 may be reversible as shown in FIGS. 9 and 10. Specifically, openings 902 in bulkhead 900 may be positioned so that they are asymmetrical or offset with respect to a center point 904 of bulkhead 900. (Bulkhead 900 need not provide an opening for every expansion card slot as in the illustration.) Bulkhead 900 may be attached to a chassis or enclosure at mounting points 906. Preferably, the chassis or enclosure is adapted to receive bulkhead 900 either in a front-facing orientation (FIG. 9) or in a rear-facing orientation (FIG. 10). Mounting bulkhead 900 to the chassis or enclosure in the front-facing orientation may produce the first configuration, while mounting the bulkhead in the rear-facing orientation may produce the second configuration, as shown. It is believed that this technique will be desirable for applications in which the desired first and second configurations are mirror-images of one another.

Figure 11:
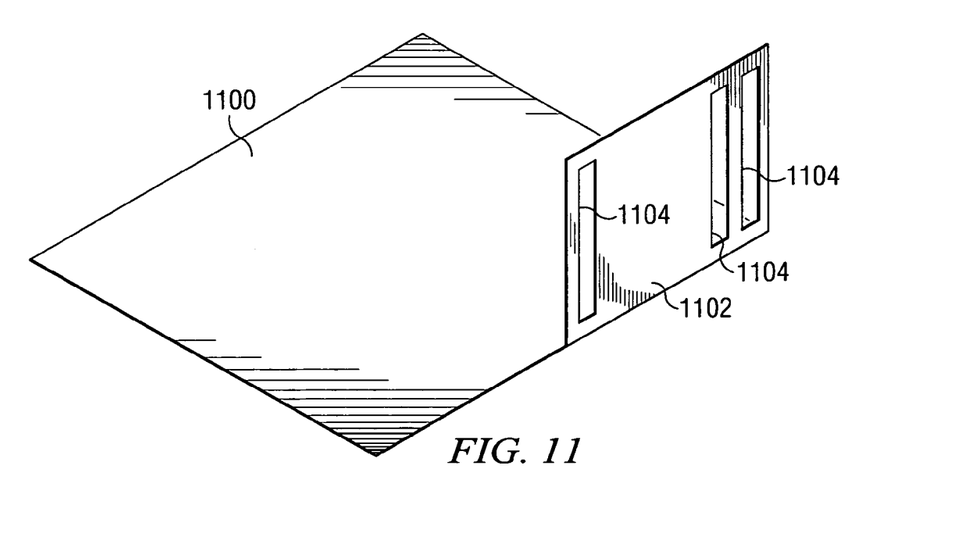
FIGS. 11 and 12 are oblique views illustrating first and second trays or frames for receiving the motherboard of FIG. 1 according to a preferred embodiment of the invention.
Figure 12:
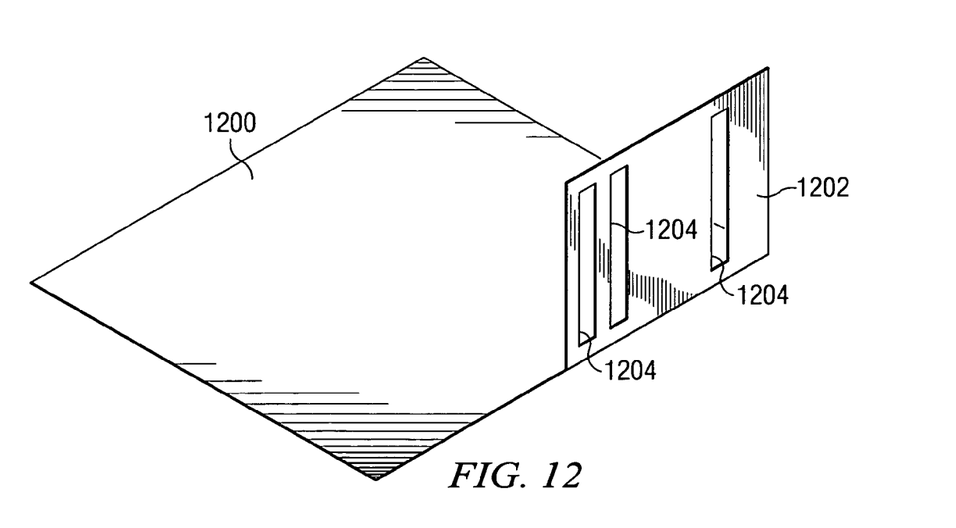

According to yet another technique illustrated in FIGS. 11 and 12, first and second trays or frames 1100, 1200 may be provided to which motherboard 100 may be mounted. Each of trays or frames 100, 1200 may include a unique expansion card bulkhead 1102, 1202 with a unique set of expansion card openings 1104, 1204 defined therein. Either the first or the second configuration may be achieved by appropriately choosing which tray or frame in which to mount motherboard 100. A chassis or enclosure adapted to receive tray or frame 1100, 1200 may include an expansion card aperture that is covered by expansion card bulkhead 1102, 1202 when the motherboard/tray assembly is installed in the chassis or enclosure.

While the invention has been described in detail with reference to preferred embodiments thereof, the described embodiments have been presented by way of example and not by way of limitation. It will be understood by those skilled in the art that various changes may be made in the form and details of the described embodiments without deviating from the spirit and scope of the invention as defined by the appended claims.

What is claimed is:

1. A computer, comprising:
   a motherboard having first and second sets of expansion card slots;
   an expansion card bulkhead defining expansion card openings; and
   a configurable alignment mechanism operable to place the motherboard and the expansion card openings into at least first and second configurations relative to one another such that, in the first configuration, the first set of expansion card slots is aligned wit the expansion card openings and, in the second configuration, the second set of expansion card slots is aligned with the expansion card openings;
   wherein the configurable alignment mechanism comprises apparatus for moving the motherboard.

2. The computer of claim 1, wherein:
   the apparatus comprises first and second mounting points on the motherboard for attachment to a chassis, tray or frame such that attaching the motherboard at the first mounting point produces the first configuration and attaching the motherboard at the second mounting point produces the second configuration.

3. The computer of claim 1, wherein:
   the apparatus comprises first and second mounting points on a chassis, tray or frame for attachment to the motherboard such that attaching the motherboard at the first mounting point products the first configuration and attaching the motherboard at the second mounting point produces the second configuration.

4. The computer of claim 1, wherein:
   the apparatus comprises first and second chassis, trays or frames for attachment to the motherboard such that attaching the motherboard to the first chassis, tray or frame produces the first configuration and attaching the motherboard to the second chassis, tray or frame produces the second configuration.

5. The computer of claim 1, wherein:
   the apparatus comprises a tray or frame having first and second mounting points for attachment to a chassis;
   the motherboard is mounted to the tray or frame; and
   attaching the fray or frame to the chassis at the first mounting point produces the first configuration and attaching the tray or frame to the chassis at the second mounting point produces the second configuration.

6. The computer of claim 1, wherein:
   the apparatus comprises a tray or frame for attachment to a chassis having first and second mounting points;
   the motherboard is mounted to the tray or frame; and
   attaching the tray or frame to the chassis at the first mounting point produces the first configuration and attaching the tray or frame to the chassis at the second mounting point produces the second configuration.

7. The computer of claim 1, wherein:

the apparatus comprises a tray or frame mounted to a chassis in such a manner that the tray or frame may slide between first and second positions relative to the chassis; and the motherboard is mounted to the tray or frame such that the first position produces the first configuration and the second position produces the second configuration.

8. The computer of claim 1:

further comprising a chassis or enclosure for housing the motherboard, the chassis or enclosure defining an I/O aperture opening for accessing integrated I/O connectors that are permanently mounted to the motherboard; and wherein the I/O aperture opening is wide enough to clear the integrated I/O connectors both in the first configuration and in the second configuration.

9. The computer of claim 8:

further comprising an I/O aperture bulkhead operable to provide EMI shielding around the integrated I/O connectors; and wherein the I/O aperture bulkhead is slidingly engaged with the I/O aperture opening such tat the I/O aperture bulkhead may move with the motherboard between the first and second configurations.

10. A computer, comprising:

a motherboard having first and second sets of expansion card slots;

an expansion card bulkhead defining expansion card openings; and a configurable alignment mechanism operable to place the motherboard and the expansion card openings into at least first and second configurations relative to one another such that in the first configuration, the first set of expansion card slots is aligned with the expansion card openings and, in the second configuration, the second set of expansion card slots is aligned with the expansion card openings;

wherein the configurable alignment mechanism comprises apparatus for moving the expansion card openings.

11. The computer of claim 10, wherein:

the apparatus comprises first and second mounting points on a chassis or enclosure for attachment of the expansion card bulkhead such that attaching the expansion card bulkhead at the first mounting point produces the first configuration and attaching the expansion card bulkhead at the second mounting point produces the second configuration.

12. The computer of claim 10, wherein:

the apparatus comprises first and second mounting points on the expansion card bulkhead for attachment to a chassis or enclosure such that attaching the expansion card bulkhead at the first mounting point produces the first configuration and attaching the expansion card bulkhead at the second mounting point produces the second configuration.

13. The computer of claim 10, wherein: the apparatus comprises a sliding engagement between the expansion card bulkhead and a chassis or enclosure such that the expansion card bulkhead may elide between first and second positions, the first position producing the first configuration and the second position producing the second configuration.

14. The computer of claim 10, wherein:

the expansion card openings are disposed asymmetrically from a center of the expansion card bulkhead; and the apparatus comprises an opening in a chassis or enclosure for receiving the expansion card bulkhead in either a front-facing orientation producing the first configuration or in a rear-facing orientation producing the second configuration.

15. The computer of claim 10, wherein:

the apparatus comprises first and second expansion card bulkheads for attachment to a chassis or enclosure such that attaching the first expansion card bulkhead to the chassis or enclosure produces the first configuration and attaching the second expansion card bulkhead to the chassis or enclosure produces the second configuration.

16. The computer of claim 15:

further comprising first and second frays or frames to which the motherboard may be mounted; and wherein the first tray or frame comprises the first expansion card bulkhead and the second fray or frame comprises the second expansion card bulkhead.

* * * * *